United States Patent
Shirinfar et al.

(10) Patent No.: US 9,312,807 B2
(45) Date of Patent: *Apr. 12, 2016

(54) LOW PHASE NOISE VOLTAGE CONTROLLED OSCILLATORS

(71) Applicant: Broadcom Corporation, Irvine, CA (US)

(72) Inventors: Farid Shirinfar, Los Angeles, CA (US); Tirdad Sowlati, Irvine, CA (US); Maryam Rofougaran, Rancho Palos Verdes, CA (US); Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/561,799

(22) Filed: Dec. 5, 2014

(65) Prior Publication Data
US 2015/0084708 A1 Mar. 26, 2015

Related U.S. Application Data

(63) Continuation of application No. 13/610,016, filed on Sep. 11, 2012, now Pat. No. 8,933,757.

(51) Int. Cl.
*H03B 5/12* (2006.01)
*H03B 1/04* (2006.01)
*H03B 5/18* (2006.01)
*H03B 27/00* (2006.01)

(52) U.S. Cl.
CPC .............. *H03B 1/04* (2013.01); *H03B 5/1215* (2013.01); *H03B 5/1228* (2013.01); *H03B 5/1243* (2013.01); *H03B 5/1262* (2013.01); *H03B 5/1293* (2013.01); *H03B 5/1296* (2013.01); *H03B 5/1852* (2013.01); *H03B 27/00* (2013.01); *H03B 2200/0048* (2013.01); *H03B 2200/0052* (2013.01)

(58) Field of Classification Search
CPC .. H03B 5/1296; H03B 5/1212; H03B 5/1206; H03B 5/1293; H03B 5/1237; H03B 5/1262; H03B 2200/0036; H03B 2200/0048; H03B 2200/0046; H03B 2200/0052
USPC ............... 331/46–49, 117 R, 117 FE, 167, 74
See application file for complete search history.

(56) References Cited

U.S. PATENT DOCUMENTS

| | | | |
|---|---|---|---|
| 6,621,363 B2 | 9/2003 | Park et al. | |
| 6,891,444 B2 | 5/2005 | Jacobsson et al. | |
| 7,423,495 B2 | 9/2008 | Bevilacqua et al. | |
| 8,058,934 B2 | 11/2011 | Rangarajan et al. | |
| 8,933,757 B2 * | 1/2015 | Shirinfar et al. | 331/117 FE |
| 2008/0174375 A1 | 7/2008 | Nakamura et al. | |
| 2008/0284534 A1 | 11/2008 | El Rai | |
| 2012/0169426 A1 | 7/2012 | Chataigner | |
| 2014/0070898 A1 | 3/2014 | Shirinfar et al. | |

* cited by examiner

Primary Examiner — Ryan Johnson
(74) Attorney, Agent, or Firm — Sterne, Kessler, Goldstein & Fox P.L.L.C.

(57) ABSTRACT

A voltage controlled oscillator (VCO) with low phase noise and a sharp output spectrum is desirable. The present disclosure provides embodiments of LC tank VCOs that generate output signals with less phase noise compared with conventional LC tank VCOs, while at the same time limiting additional cost, size, and/or power. The embodiments of the present disclosure can be used, for example, in wired or wireless communication systems that require low-phase noise oscillator signals for performing up-conversion and/or down-conversion.

20 Claims, 9 Drawing Sheets

LOW PHASE NOISE VOLTAGE CONTROLLED OSCILLATORS

CROSS REFERENCE TO RELATED APPLICATIONS

This patent application is a continuation of U.S. patent application Ser. No. 13/610,016, filed Sep. 11, 2012, which is incorporated herein by reference in its entirety.

FIELD OF THE INVENTION

This application relates generally to oscillators and, more specifically, to voltage controlled oscillators (VCOs).

BACKGROUND

An ideal voltage controlled oscillator (VCO) generates a single-tone output signal at a frequency determined as a linear function of an input control voltage. For such an ideal VCO, the spectrum of the output signal assumes the shape of an impulse. In practice, however, the output signal generated by a VCO includes random fluctuations referred to as phase noise. Phase noise is seen in the spectrum of the output signal as "skirting" around the impulse. In communication systems that use a VCO output signal to up-convert or down-convert a signal, this phase noise can corrupt the resulting frequency-translated signal.

For example, in a received signal, a desired channel centered at a frequency $\omega_0$ can be spaced very close to a strong, undesired channel centered at a frequency $\omega_{0-\Delta f}$. To down-convert the desired channel to baseband, the VCO can be tuned to provide an output signal with a frequency equal to the center frequency $\omega_0$ of the desired channel, and the two signals can be mixed. In the ideal case, the VCO output signal consists of a single tone, with no phase noise, at a frequency $\omega_0$, and only the desired channel is down-converted to baseband. In practice, however, the VCO output signal includes phase noise around the single tone at $\omega_0$. This phase noise further mixes with the received signal, which may result in the strong, undesired channel being down-converted to baseband if the bandwidth of the phase noise is larger than the distance separating the two channels (i.e., larger than $\Delta f$).

Assuming the bandwidth of the phase noise is larger than the distance separating the two channels, the undesired channel will interfere with the desired channel at baseband in the down-converted signal, reducing the sensitivity of the receiver. The effect of phase noise is similar for up-conversion. Therefore, for this reason and others, a VCO with low phase noise and a sharp output spectrum is desirable.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

1. Overview

A VCO with low phase noise and a sharp output spectrum is desirable. The present disclosure provides embodiments of inductor-capacitor (LC) tank VCOs that generate output signals with less phase noise compared with conventional LC tank VCOs, while at the same time limiting additional cost, size, and/or power. The embodiments of the present disclosure can be used, for example, in wired or wireless communication systems that require low-phase noise oscillator signals for performing up-conversion and/or down-conversion. Before describing the specific embodiments of the present disclosure, a general overview of LC tank VCOs and their implementations is provided.

Figure 1:
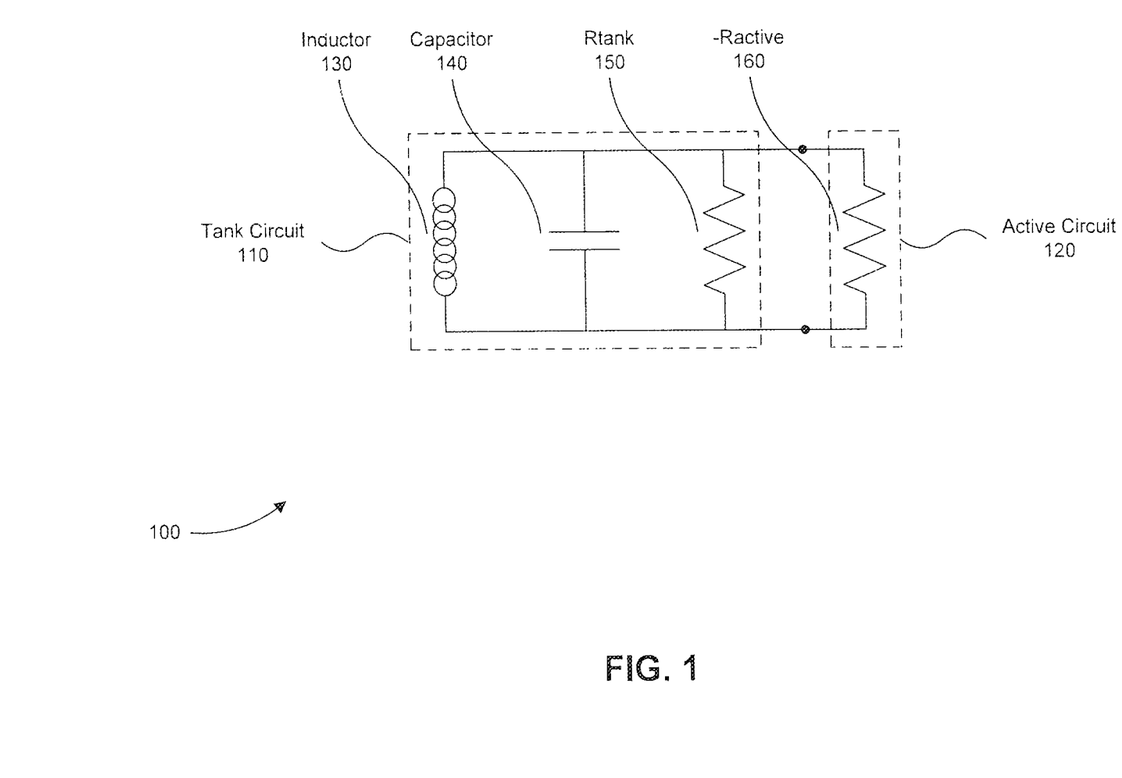
FIG. 1 illustrates a generic inductor-capacitor (LC) tank VCO in accordance with embodiments of the present disclosure.

Referring now to FIG. 1, a generic LC tank VCO 100 is illustrated. The generic LC tank VCO 100 generates an oscillating output signal using a tank circuit 110 and an active circuit 120. The tank circuit 110 includes an inductor 130 placed in parallel with a capacitor 140. The parallel combination of inductor 130 and capacitor 140 resonates at a frequency given approximately by:

$$\omega_{res} = 1/\sqrt{LC} \quad (1)$$

From equation (1), it becomes apparent that the resonant frequency of tank circuit 110 can be tuned by adjusting either the inductance (L) of inductor 130 or the capacitance (C) of capacitor 140. In practice, the capacitance of capacitor 140 is typically made adjustable via an input control signal. For example, capacitor 140 can be implemented as a programmable bank of capacitors and/or a varactor that can be controlled by an input control signal to vary its capacitance. The energy resonating within the tank circuit 110 is used to form the oscillating output signal of LC tank VCO 100.

At the resonant frequency defined by $\omega_{res}$, the impedance of inductor 130 and capacitor 140 are ideally equal and opposite, yielding a theoretically infinite impedance. However, practical inductors and capacitors, such as inductor 130 and capacitor 140, have an associated series resistance. Tank circuit 110 models this series resistance of inductor 130 and capacitor 140 (as well as other sources of resistances in VCO 100) as a finite, parallel resistance Rtank 150.

In order for tank circuit 110 to oscillate, the losses from Rtank 150 need to be overcome. Therefore, active circuit 120 is typical used to offset (i.e., cancel) the losses incurred by Rtank 150. Active circuit 120 includes a negative, active resistance, −Ractive 160, that satisfies the following equation in order for circuit 110 to oscillate:

$$\frac{1}{R_{active}} \geq \frac{1}{R_{tank}} \quad (2)$$

Figure 2:
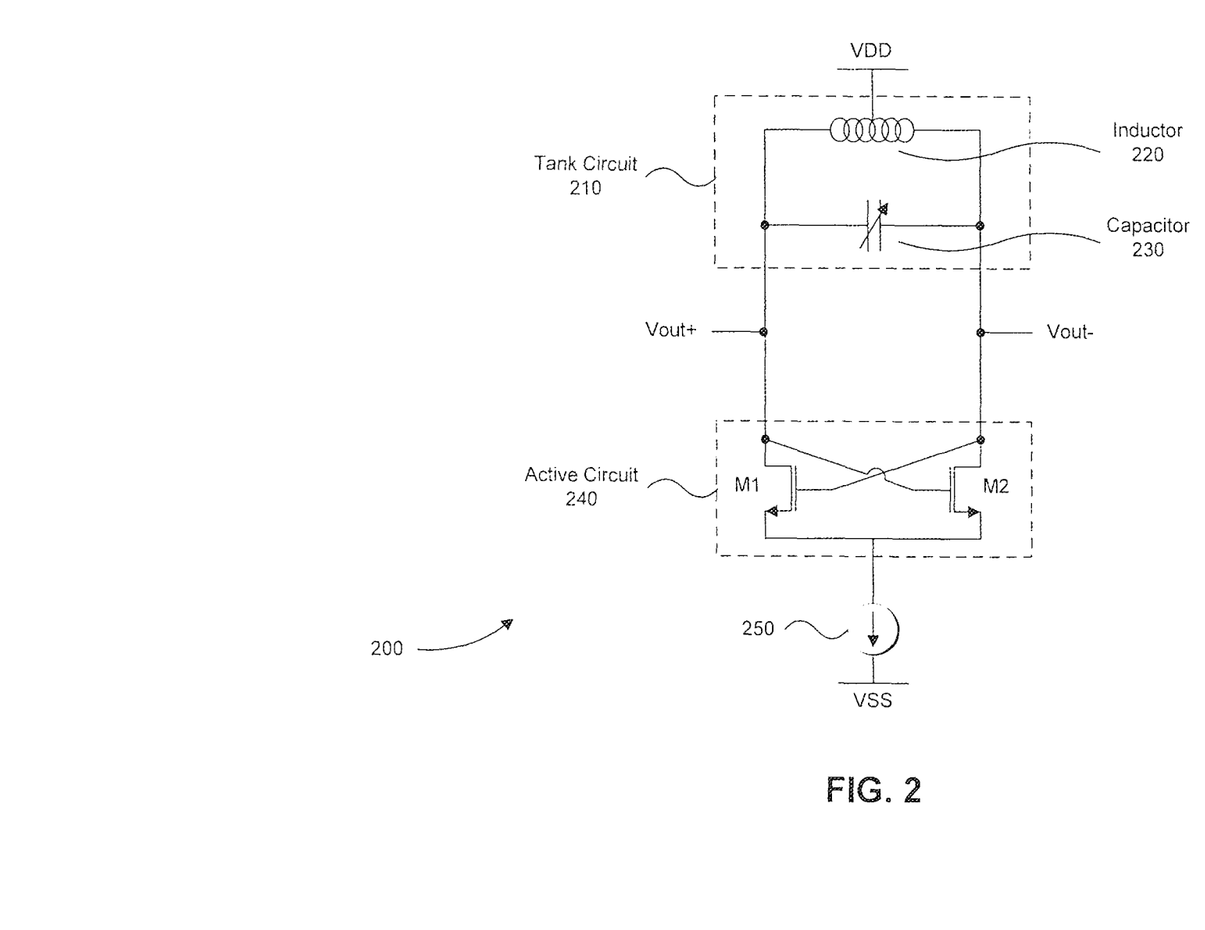
FIG. 2 illustrates a specific implementation of an LC tank VCO in accordance with embodiments of the present disclosure.

Referring now to FIG. 2, an exemplary implementation of a differential LC tank VCO 200 is illustrated. As shown in FIG. 2, differential LC tank VCO 200 includes a tank circuit 210 with an inductor 220 and a capacitor 230, an active circuit 240 that provides a negative resistance to offset resistive loses of differential LC tank VCO 200, and a tail current source 250. A differential oscillating output signal Vout is provided as output across tank circuit 210.

Active circuit 240 is formed by a differential pair of transistors M1 and M2 that have been cross coupled in a positive feedback configuration. Specifically, transistors M1 and M2 are n-type metal-oxide semiconductor field effect transistors (MOSFETs), where the gate of each transistor has been connected to the other transistors drain. The source of each transistor is connected to a supply voltage VSS through tail current source 250. Supply voltage VSS is either at ground or a negative potential relative to a supply voltage VDD coupled to a center tap of inductor 220. Tail current source 250 is generally used to bias transistors M1 and M2.

Transistors M1 and M2 essentially form a common-source amplifier with a complex, tuned load that includes tank circuit 210. Through the cross coupled pair, active circuit 240 is configured to provide a negative resistance to offset the losses incurred by the positive, finite resistance of the complex, tuned load (and other sources of resistances in differential LC tank VCO 200). The negative resistance is substantially equal to $-2/g_m$, where $g_m$ represents the transconductance of transistors M1 and M2.

The exemplary implementation of differential LC tank VCO 200 is used to describe the various embodiments of the present disclosure below. However, it should be noted that the various embodiments of the present disclosure are not limited to using this specific differential LC tank VCO implementation. For example, other differential LC tank VCO implementations that include different transistor types to implement the cross coupled pair of active circuit 240, such as p-type MOSFETs, or a different active circuit implementation all together can be used. A complementary metal oxide semiconductor (CMOS) implementation of active circuit 240 is also possible, with two cross coupled pair of transistors: a first cross coupled pair with n-type MOSFETs and a second cross coupled pair with p-type MOSFETs. In general, any reasonable differential LC tank VCO implementation can be used with the various embodiments of the present disclosure as will be appreciated by one of ordinary skill in the art.

2. Multi-Injection VCOs

Figure 3:
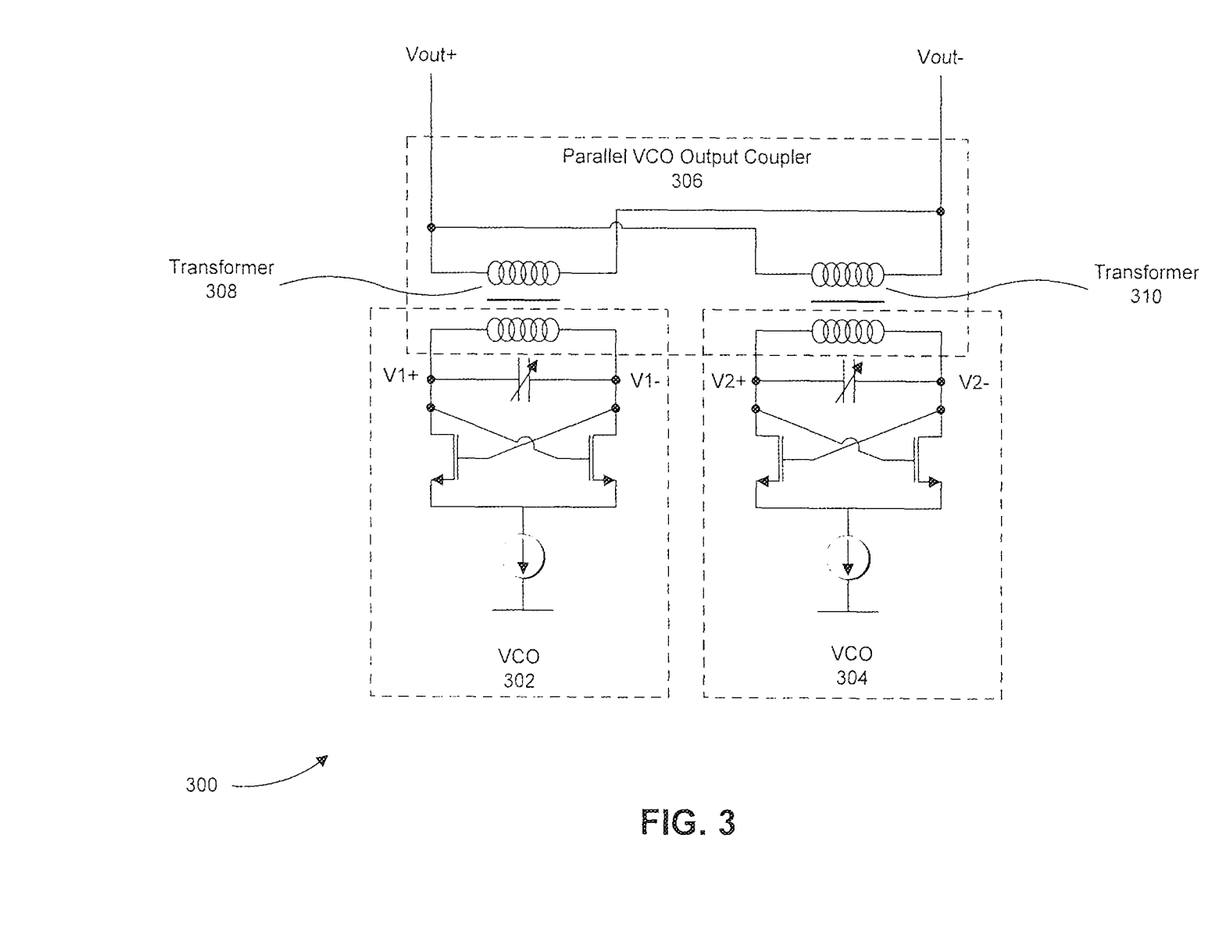
FIG. 3 illustrates a multi-injection LC tank VCO with parallel coupled VCOs in accordance with embodiments of the present disclosure.

FIG. 3 illustrates a multi-injection VCO 300 in accordance with embodiments of the present disclosure. Multi-injection VCO 300 includes two LC tank VCOs 302 and 304, and a parallel VCO output coupler 306. Multi-injection VCO 300 is configured to provide a low phase noise oscillating output signal at a differential output Vout by combining the oscillating output signals of LC tank VCOs 302 and 304 and, potentially, the oscillating output signals of other LC tank VCOs (not shown). LC tank VCOs 302 and 304 are configured and controlled to provide oscillating output signals in phase with one another (not considering their respective phase noises) and at the same frequency.

In general, it can be shown that a signal containing random noise can have its signal-to-noise ratio (SNR) improved by combining multiple copies of the signal generated in substantially similar manners. The basic concept is that, if the noise is random and the signal is constant, the signal will add with each copy combined (assuming the signal from each copy is correlated) but the noise will, at least in part, cancel due to its random nature (assuming the noise from each copy is uncorrelated). The phase noise inherent in the oscillating output signals produced by LC tank VCOs 302 and 304 is random. Therefore, by combining the oscillating output signals of LC tank VCOs 302 and 304, the SNR of the combined oscillating output signal can be improved relative to any one of the individual oscillating output signals provided by IC tank VCOs 302 and 304.

Parallel VCO output coupler 306 is used to combine the individual oscillating output signals provided by LC tank VCOs 302 and 304. Specifically, parallel VCO output coupler 306 includes two transformers: a first transformer 308 configured to magnetically couple the oscillating output signal generated by LC tank VCO 302 to differential output Vout, and a second transformer 310 configured to magnetically couple the oscillating output signal generated by VCO 304 to differential output Vout. Because the oscillating output signals of LC tank VCOs 302 and 304 are coupled to the same output, they are combined. As is shown in FIG. 3, parallel VCO output coupler 306 specifically combines the oscillating output signals of LC tank VCOs 302 and 304 in parallel.

In an embodiment, and as shown in FIG. 3, one of the windings of transformer 308 is used not only to magnetically couple the oscillating output signal generated by LC tank VCO 302 to differential output Vout, but is further used to form, at least in part, the LC tank resonator of LC tank VCO 302. More specifically, one of the windings of transformer 308 is further used to form the inductor of the LC tank resonator of LC tank VCO 302. In this way, area can be conserved. Similarly, in an embodiment, one of the windings of transformer 310 can be further used to form, at least in part, the LC tank resonator of LC tank VCO 304 to conserve area.

In order to substantially synchronize the phases of the oscillating output signals generated by LC tank VCOs 302 and 304, before they are combined by parallel VCO output coupler 306, LC tank VCOs 302 and 304 can be adjusted based on a common oscillating reference signal. For example, LC tank VCOs 302 and 304 can be implemented within respective phase-locked loops (PLLs), and the phase of their respective oscillating output signals (or some frequency divided version of their respective oscillating output signals) can be compared to the phase of the same oscillating reference signal (e.g., the same oscillating reference signal produced by a crystal oscillator) using the PLLs. Any difference in phase between the oscillating output signals of VCOs 302 and 304 (or some frequency divided version of the oscillating output signals of VCOs 302 and 304) from the oscillating reference signal can be used to adjust their respective phases. The phases can be adjusted by varying the capacitance of the capacitors and/or varactors in the tank circuits of LC tank VCOs 302 and 304.

In another embodiment, as opposed to using an individual PLL for each LC tank VCO 302 and 304 to adjust their respective oscillating output signals based a common reference signal, a single PLL can be used. The single PLL, can be used to compare the phase of the combined output oscillating signal provided at differential output Vout (or some frequency divided version of the combined oscillating output signal provided at differential output Vout) to a reference signal and, based on this comparison, adjust the respective phases of each LC tank VCO 302 and 304. Again, the phases can be adjusted by varying the capacitance of the capacitors and/or varactors in the tank circuits of LC tank VCOs 302 and 304.

After the oscillating output signals of LC tank VCOs 302 and 304 are made to be in phase with each other, parallel VCO output coupler 306 can be configured to maintain this phase relationship. For example, parallel VCO output coupler 306 can be constructed to provide equal routing delays from the respective points where the oscillating output signals generated by LC tank VCOs 302 and 304 are sensed as inputs (i.e., at transformers 308 and 310), to the point where they are sensed as a combined output (i.e., at differential output Vout). Equal routing delays can be achieved by making the routing lengths from the respective points where the oscillating output signals are sensed as inputs, to the point where they are sensed as a combined output, equal. This assumes similar routing materials (e.g. materials with similar per unit resistances and capacitances) and routing layouts (e.g., same number of turns) are used.

It should be noted that multi-injection VCOs, such as multi-injection VCO 300, has further benefits other than phase noise improvement. For example, the distribution of VCOs in multi-injection VCOs can allow a required power to be divided among the VCOs, thereby placing less stress on the devices implementing them (e.g., transistors) and resulting in a longer lifetime. In addition, the distribution of VCOs in multi-injection VCOs can improve reliability. For example, if one or more of the distributed VCOs stops functioning or stops functioning within required design parameters, the multi-injection VCO can still be used to provide an oscillating output signal.

Figure 4:
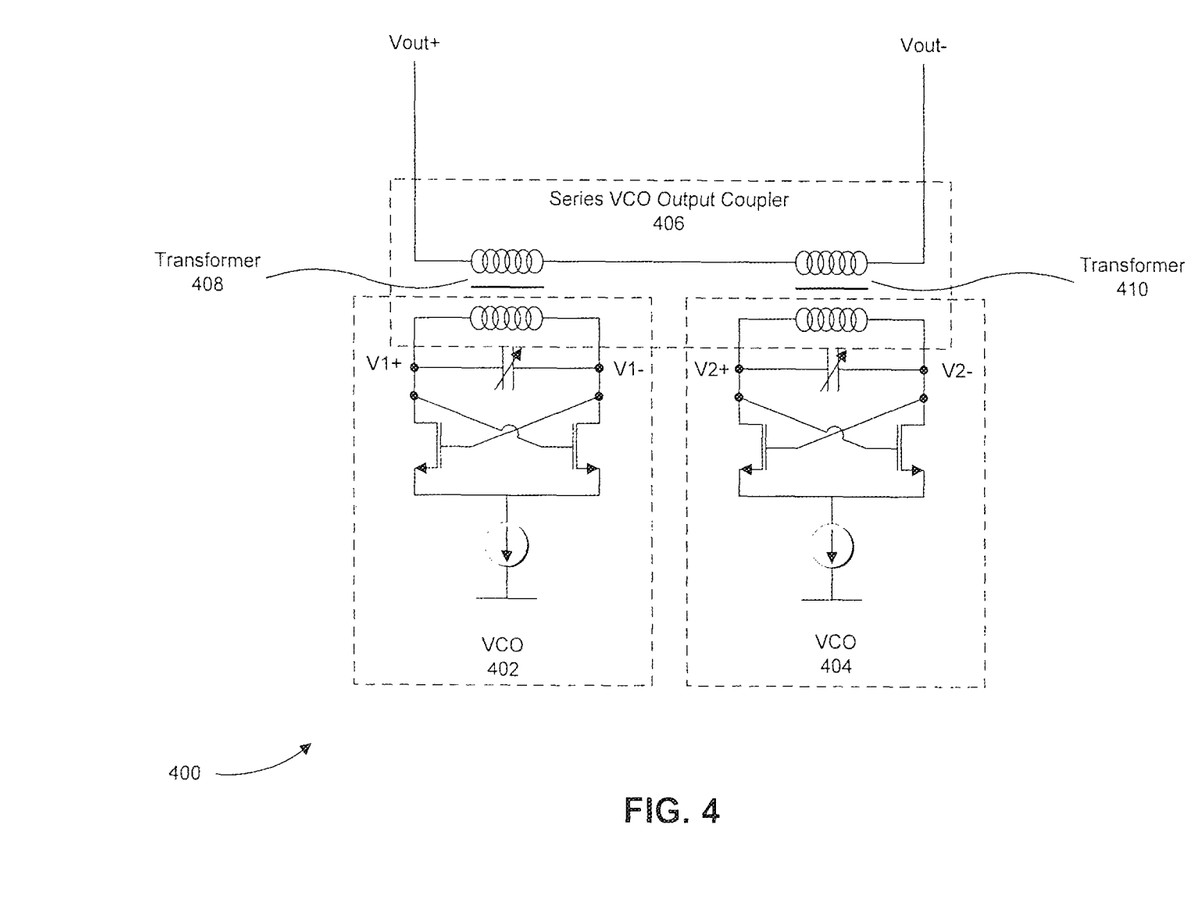
FIG. 4 illustrates a multi-injection LC tank VCO with series coupled VCOs in accordance with embodiments of the present disclosure.

Referring now to FIG. 4, another multi-injection VCO 400 is illustrated in accordance with embodiments of the present disclosure. Multi-injection VCO 400 includes two LC tank VCOs 402 and 404, and a series VCO output coupler 406. Similar to multi-injection VCO 300 in FIG. 3, multi-injection VCO 400 is configured to provide a low phase noise oscillating output signal at a differential output Vout by combining the oscillating output signals of LC tank VCOs 402 and 404 and, potentially, the oscillating output signals of other LC tank VCOs (not shown). However, unlike multi-injection VCO 300, which combines the oscillating output signals of LC tank VCOs 302 and 304 in parallel, multi-injection VCO 400 combines the oscillating output signals of LC tank VCOs 402 and 404 in series. This is shown by the configuration of series VCO output coupler 406.

Figure 5:
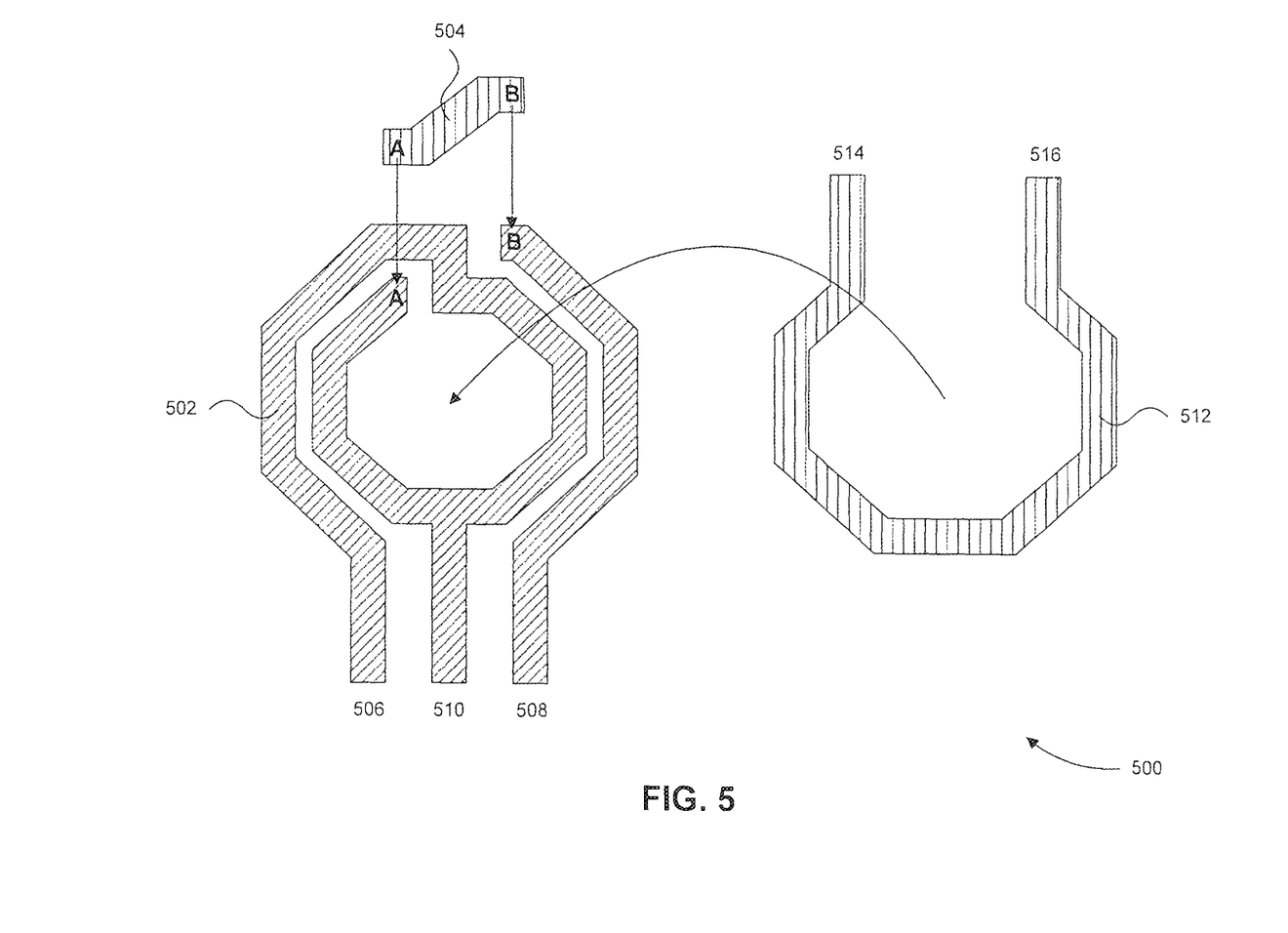
FIG. 5 illustrates a layout of a transformer for use in a multi-injection LC tank VCO in accordance with embodiments of the present disclosure.

Referring now to FIG. 5, an exemplary integrated circuit layout of a transformer 500 that can be used to couple the oscillating output signal of an LC tank VCO to the oscillating output signals of other LC tank VCOs is illustrated in accordance with embodiments of the present disclosure. For example, transformer 500 can be used to implement transformer 308 or 310 in FIG. 3 or transformer 408 or 410 in FIG. 4.

As shown in FIG. 5, transformer 500 specifically includes two spiral inductors that form its windings: a first spiral inductor 502 with two ends 506 and 508 and a center tap 510, and a second spiral inductor 512 with two ends 514 and 516. Although the two spiral inductors 502 and 512 are shown in FIG. 5 as being laid out flat next to each other for ease of illustration, in actual implementation the two spiral inductors 502 and 512 are stacked, with one of the spiral inductors on top of the other. In an integrated circuit, the two spiral inductors can be stacked by using different metal layers. For example, spiral inductor 502 can use a second metal layer in the integrated circuit, and spiral inductor 512 can use a third metal layer that is positioned above the second metal layer on the substrate of the integrated circuit.

In the embodiment of FIG. 5, spiral inductor 502 includes two loops that are predominately in one metal layer of an integrated circuit. A small portion 504 of spiral inductor 502 is implemented in another metal layer to prevent the two loops from being coupled together at an undesired point. It should be noted that, in other embodiments of transformer 500, spiral inductor 502 can be implemented with more than two loops.

When transformer 500 is used to implement transformer 308 or 310 in FIG. 3 or transformer 408 or 410 in FIG. 4, spiral inductor 502 can be used to form the inductor of an LC tank VCO, and spiral inductor 512 can be used to magnetically couple the signal flowing through spiral inductor 502 to an output.

Figure 6:
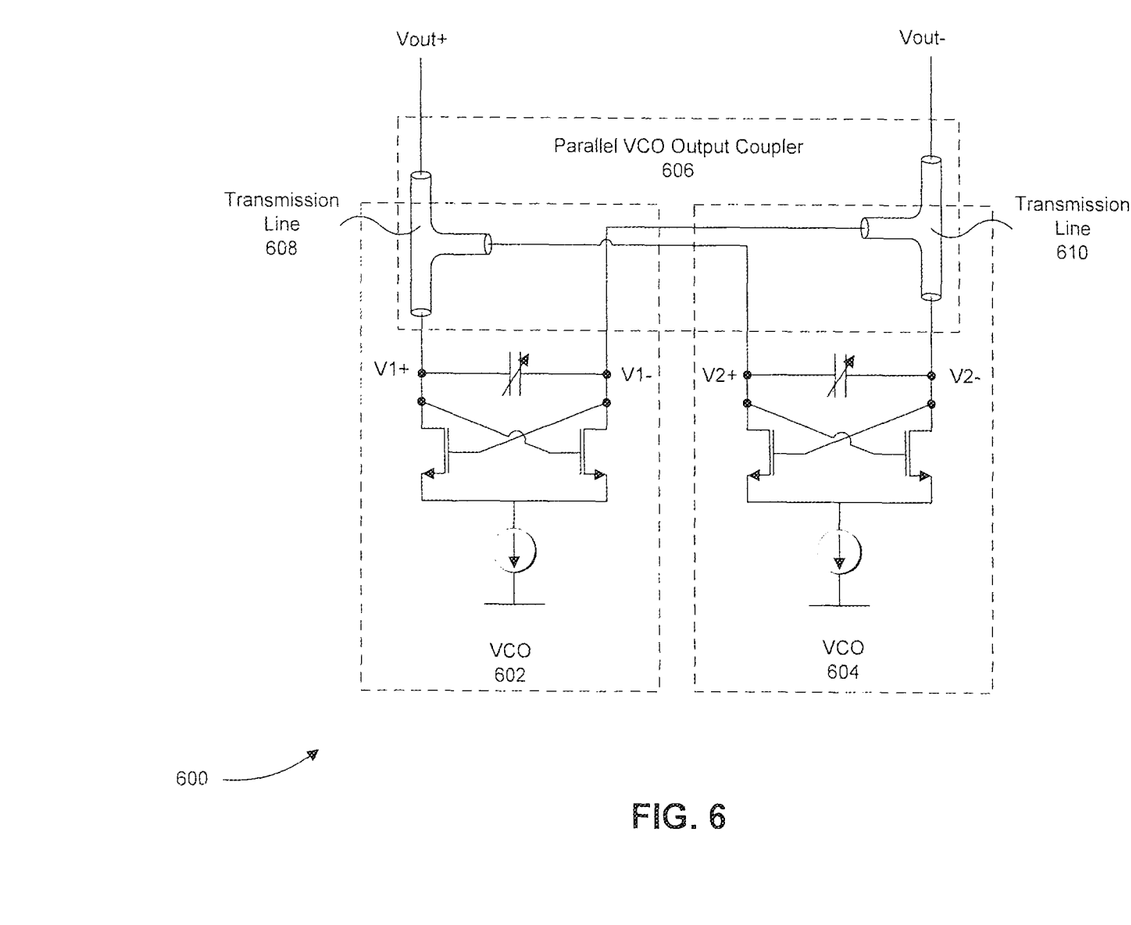
FIG. 6 illustrates another multi-injection LC tank VCO with parallel coupled VCOs in accordance with embodiments of the present disclosure.

Referring now to FIG. 6, a multi-injection VCO 600 is illustrated in accordance with embodiments of the present disclosure. Multi-injection VCO 600 includes two LC tank VCOs 602 and 604, and a parallel VCO output coupler 606. Similar to multi-injection VCO 300 in FIG. 3 and multi-injection VCO 400 in FIG. 4, multi-injection VCO 600 is configured to provide a low phase noise oscillating output signal at a differential output Vout by combining the oscillating output signals of LC tank VCOs 602 and 604 and, potentially, the oscillating output signals of other LC tank VCOs (not shown). However, unlike multi-injection VCOs 300 and 400, which combine the oscillating output signals of LC tank VCOs using transformers, multi-injection VCO 600 combines the oscillating output signals of LC tank VCOs 602 and 604 in parallel using transmission lines 608 and 610.

In general, a transmission line is a conductor that carries signals with frequency components having wavelengths comparable to or less than the length of the conductor. For example, conductors with lengths greater than 1/10 of the wavelengths of the signals they carry can be considered transmission lines. Thus, in at least one embodiment, transmission lines 608 and 610 are constructed to have lengths greater than $\frac{1}{10}$ of the wavelengths of the oscillating output signals generated by LC tank VCOs 602 and 604. However, other lengths are possible (e.g., greater than or equal to a half wave length or quarter wave length). Transmission lines 608 and 610 can be constructed using a ladder line, stripline, dielectric slab, or waveguide, for example.

Transmission lines 608 and 610 have a characteristic impedance as seen by LC tank VCOs 602 and 604 that is dependent on at least: (1) the length of the transmission lines (as measured from the point where they are respectively coupled to LC tank VCOs 602 and 604, to the output at Vout); (2) the load impedance coupled at the output Vout; and (3) the wavelength of the oscillating output signals generated by VCOs 602 and 604 as carried by transmission lines 608 and 610. In the embodiment of FIG. 6, one or more of these values are set or adjusted such that the characteristic impedance of transmission lines 608 and 610, as seen by LC tank VCOs 602 and 604, provides a desired inductance for the LC tank resonators of LC tank VCOs 602 and 604. In this way, area can be conserved because the transmission line conductors, used to couple the oscillating output signals generated by VCOs 602 and 604, are further used to form, at least in part, the LC tank resonators of LC tank VCOs 602 and 604.

3. Compact Multi-Band VCO

Described below is another approach for reducing VCO phase noise, while keeping area requirements low, when oscillating output signals with frequencies over a large range are desired. For example, today's wireless devices often support multiple wireless standards that operate over multiple frequency bands. A cellular phone or handset may be configured to communicate with both second and third generation wireless communications systems using multiple standards (e.g., EDGE/GSM/WCDMA) and frequency bands (e.g., the 900, 1800, and 2100 MHz bands). A wireless local area network device is another common wireless device that may be configured to support multiple standards (e.g., IEEE's 802.11a/b/g/ac/ad standards) and frequency bands.

These multi-band wireless devices include a radio frequency (RF) front-end to up-convert a signal for transmission over a wireless link and to down-convert a signal received over a wireless link. The RF front-end typically includes a VCO to generate a local oscillator (LO) signal to perform this up-conversion and down-conversion. In wireless devices, the VCO is typically implemented using an LC tank circuit that includes an inductor and one or more capacitors as described above. The frequency of the LO signal generated by the VCO can be controlled by varying the capacitance of the LC tank. A VCO can generally achieve good performance over a small tuning range. However, for a large tuning range the resistive impedance of the LC tank circuit can vary considerably, which results in a relatively large and undesirable variation in the VCO phase noise over the different, supported frequency bands.

To combat phase noise, a wireless device that supports multiple bands that are spaced far apart can employ multiple VCOs. Each VCO can then be designed to achieve good phase noise performance for a specific frequency band. However, the use of multiple VCOs for multiple frequency bands increases cost and area in an integrated circuit (IC) implementation.

Figure 7:
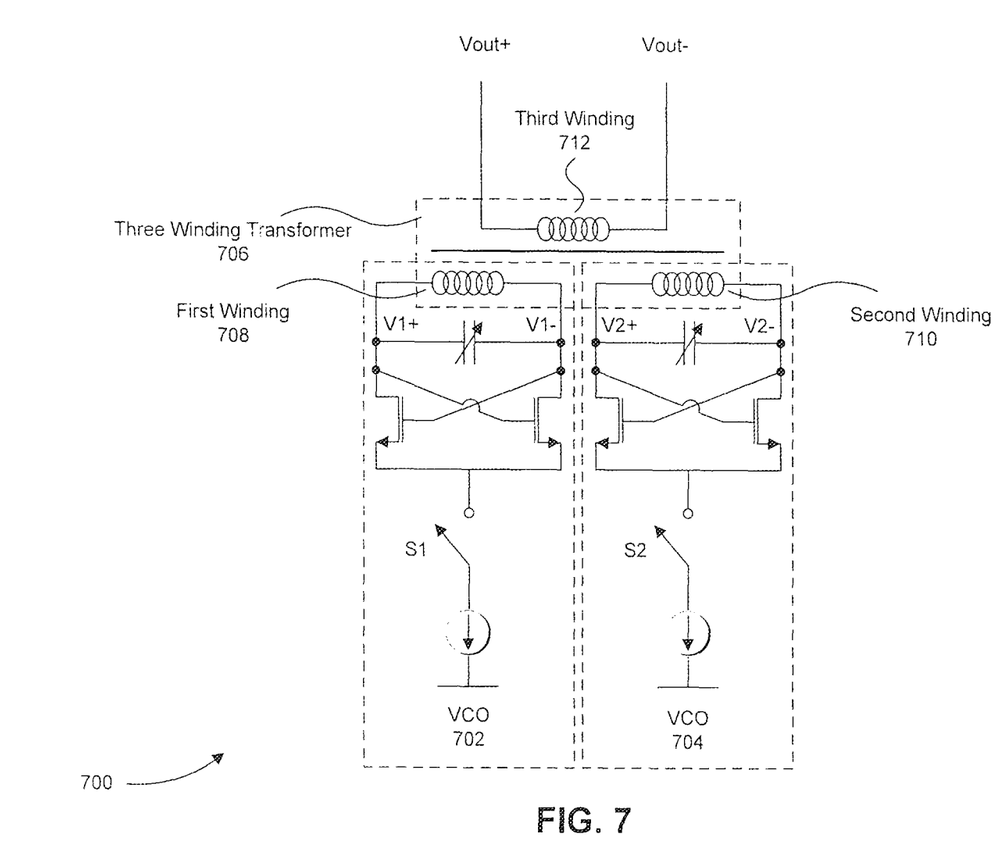
FIG. 7 illustrates a compact, multi-band VCO in accordance with embodiments of the present disclosure.

FIG. 7 illustrates one potential solution to these drawbacks. Specifically, FIG. 7 illustrates a multi-band VCO 700 in accordance with embodiments of the present disclosure. Multi-band VCO 700 includes two LC tank VCOs 702 and 704 and a three winding transformer 706. LC tank VCO 702 is configured to generate an oscillating output signal with a frequency that can be tuned over (or that is centered within) a first one of two different frequency bands, and LC tank VCO 704 is configured to generate an oscillating output signal with a frequency that can be tuned over (or that is centered within) a second one of the two different frequency bands. Because LC tank VCOs 702 and 704 each respectively provide an oscillating output signal with a frequency over (or centered within) one frequency band, each can be designed to achieve good phase noise performance over its specific frequency band.

Three winding transformer 706 provides for a compact implementation of multi-band VCO 700 and is configured to couple the oscillating output signals generated by LC tank VCOs 702 and 704 to a differential output Vout. Three winding transformer specifically includes a first winding 708 electrically coupled to the oscillating output signal generated by LC tank VCO 702, a second winding 710 electrically coupled to the oscillating output signal generated by LC tank VCO 704, and a third winding electrically coupled to the differential output Vout. Three winding transformer 706 is configured to magnetically couple the oscillating output signal generated by LC tank VCO 702 to the output Vout using first winding 708 and third winding 712, and to magnetically couple the oscillating output signal generated by LC tank VCO 704 to the output Vout using second winding 710 and third winding 712.

By using three winding transformer 706 to couple the oscillating output signals generated by LC tank VCOs 702 and 704 to differential output Vout, as opposed to using two separate transformers, multi-band VCO 700 can be more compactly implemented. However, because third winding 712 is shared between the two LC tank VCOs 702 and 704 a controller (not shown) can be used to turn one of the two LC tank VCOs 702 and 704 off while the other one is operating. For example, a switch S1 and a switch S2 can be respectively included in LC tank VCOs 702 and 704 to turn one of them off while the other is on, as directed by a controller.

In an embodiment, first winding 708 of three winding transformer 706 is used not only to magnetically couple the oscillating output signal generated by LC tank VCO 702 to differential output Vout, but is further used to form, at least in part, the LC tank resonator of LC tank VCO 702. More specifically, first winding 708 is further used to form the inductor of the LC tank resonator of LC tank VCO 702. In this way, further area can be conserved. Similarly, in an embodiment, second winding 710 of three winding transformer 706 can be further used to form, at least in part, the LC tank resonator of LC tank VCO 704 to conserve area.

Figure 8:
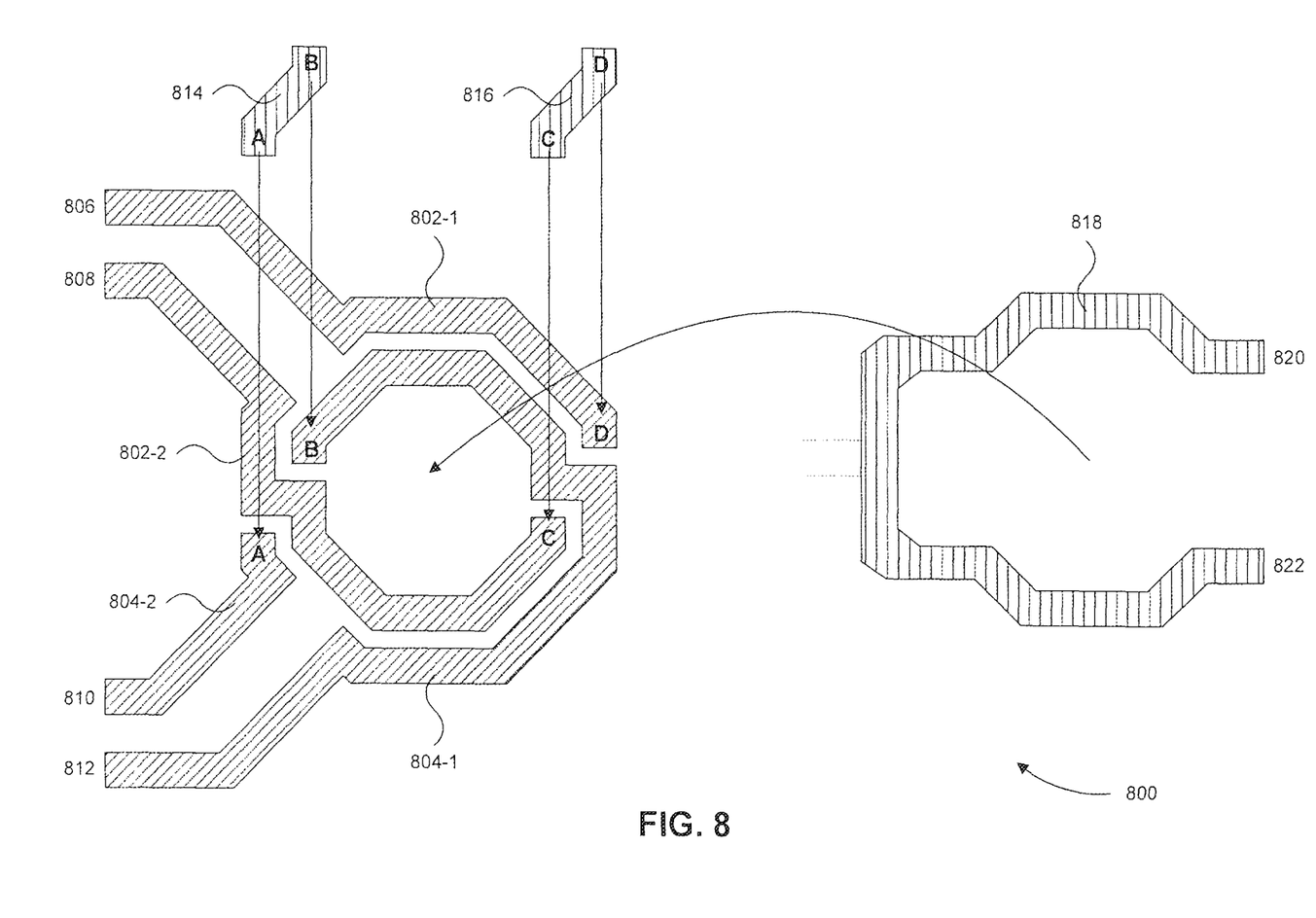
FIG. 8 illustrates a layout of a three winding transformer for use in a compact, multi-band VCO in accordance with embodiments of the present disclosure.

Referring now to FIG. 8, an exemplary layout of a three winding transformer 800 that can be used to couple the oscillating output signals of two LC tank VCOs to a common output is illustrated in accordance with embodiments of the present disclosure. For example, transformer 800 can be used to implement three winding transformer 706 in FIG. 7.

As shown in FIG. 8, transformer 800 specifically includes three spiral inductors that form its windings: a first spiral inductor 802 with two ends 806 and 808, a second spiral inductor 804 with two ends 810 and 812, and a third spiral inductor 818 with two ends 820 and 822. In the embodiment of FIG. 8, spiral inductors 802 and 804 are implemented predominately in the same metal layer of integrated circuit. Two small portions 814 and 816 of spiral inductors 802 and 804 are implemented in another metal layer to prevent the two spiral inductors from being electrically coupled together.

Although spiral inductor 818 is shown as being laid out next to spiral inductors 802 and 804 for ease of illustration, in actual implementation spiral inductor 818 is stacked on top of or below spiral inductors 802 and 804 using a different metal layer. For example, spiral inductors 802 and 804 can use a second metal layer in an integrated circuit, and spiral inductor 818 can use a third metal layer that is positioned above the second metal layer on the substrate of the integrated circuit.

When transformer 800 is used to implement three winding transformer 706 in FIG. 8, spiral inductor 802 can be used to form the first winding 708 and the inductor of LC tank VCO 702, spiral inductor 804 can be used to form the second winding 710 and the inductor of LC tank VCO 704, and spiral inductor 806 can be used to form the third winding.

Figure 9:
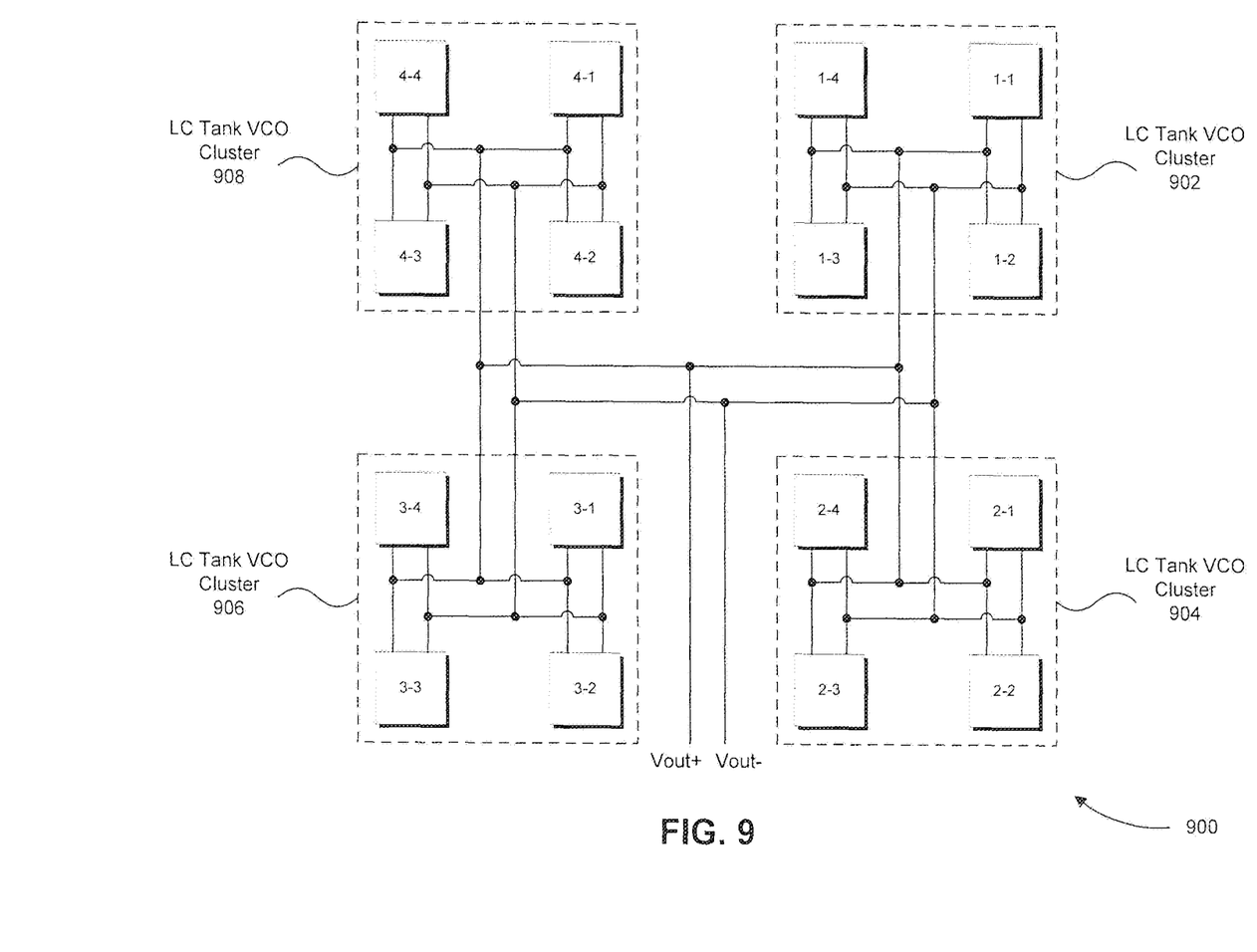
FIG. 9 illustrates a multi-band, multi-injection VCO in accordance with embodiments of the present disclosure.

Referring now to FIG. 9, a multi-band, multi-injection VCO 900 in accordance with embodiments of the present disclosure is illustrated. Multi-band, multi-injection VCO 900 includes four clusters 902, 904, 906, and 908 of LC tank VCOs, and each cluster 902-908 includes four LC tank VCOs. Cluster 902 includes LC tank VCOs 1-1 through 1-4, cluster 904 includes LC tank VCOs 2-1 through 2-4, cluster 906 includes LC tank VCOs 3-1 through 3-4, and cluster 908 includes LC tank VCOs 4-1 through 4-4. It should be noted that, in other embodiments, more or less clusters can be used, and each cluster can include more or less LC tank VCOs.

Each of the four clusters 902-908 is configured to generate an oscillating output signal with a frequency that can be tuned over (or that is centered within) a different frequency band. Because clusters 902-908 each respectively provide an oscillating output signal with a frequency over (or centered within) one frequency band, their respective LC tank VCOs can be designed to achieve good phase noise over their respective frequency bands.

In an embodiment, the oscillating output signals of the LC tank VCOs of one or more of clusters 902-908 are combined in parallel or series in a manner consistent with that disclosed above in FIG. 3 and FIG. 4, respectively. For example, the oscillating output signals of LC tank VCOs 1-1 through 1-4 in cluster 902 can be combined in series using a first set of transformers in a manner consistent with that disclosed above in FIG. 3. By combining the oscillating output signals of LC tank VCOs 1-1 through 1-4, phase noise can be reduced.

In another embodiment, a controller (not shown) is configured to turn off all but one of the clusters in multi-band, multi-injection VCO 900. This prevents the clusters from interfering with each other due to the fact that their outputs are all coupled to the same differential output Vout as shown in FIG. 9.

In yet another embodiment, a controller (not shown) is configured to turn on/off an adjustable number of LC tank VCOs within one or more of clusters 902-908. For example, assuming cluster 902 is currently in operation and providing an oscillating output signal at differential output Vout, the number of LC tank VCOs 1-1 through 1-4 currently being used by cluster 902 can be controlled by the controller based any number of different criteria. The different criteria can include, for example, a power requirement, a phase noise requirement, a SNR or modulation order of a signal to be down-converted using the oscillating output signal generated by cluster 902, or the presence of nearby blockers to a desired channel in a signal to be down-converted. For example, if low power is required, less of the LC tank VCOs 1-1 through 1-4 can be turned on to generate the oscillating output signal provided at differential output Vout. If low phase noise is required, more of the LC tank VCOs 1-1 through 1-4 can be turned on to generate the oscillating output signal provided at differential output Vout.

It should be noted that, rather than supporting separate frequency bands, the LC tank VCOs noted above in regard to FIGS. 7-9 can support separate frequency channels, or can be said to support separate frequency channels. Frequency channels are generally understood to be narrower in terms of bandwidth than frequency bands.

4. Conclusion

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

What is claimed is:

1. A multi-injection voltage controlled oscillator (VCO) for providing an output oscillating signal at an output, the multi-injection VCO comprising:
   a first inductor-capacitor tank VCO configured to generate a first oscillating signal;
   a second inductor-capacitor tank VCO configured to generate a second oscillating signal; and
   an output coupler configured to magnetically couple the first oscillating signal to the second oscillating signal in series to provide the output oscillating signal at the output.

2. The multi-injection VCO of claim 1, wherein the output coupler comprises:
   a three winding transformer comprising a first winding electrically coupled to the first oscillating signal, a second winding electrically coupled to the second oscillating signal, and a third winding electrically coupled to the output of the multi-injection VCO.

3. The multi-injection VCO of claim 2, wherein the three winding transformer is configured to magnetically couple the first oscillating signal to the output of the multi-injection VCO using the first winding and the third winding, and to magnetically couple the second oscillating signal to the output of the multi-injection VCO using the second winding and the third winding.

4. The multi-injection VCO of claim 3, wherein the first winding is used to form a resonator of the first inductor-capacitor tank VCO, and the second winding is used to form a resonator of the second inductor-capacitor tank VCO.

5. The multi-injection VCO of claim 1, wherein the output coupler comprises:
   a first transformer configured to magnetically couple the first oscillating signal to the output; and
   a second transformer configured to magnetically couple the second oscillating signal to the output.

6. The multi-injection VCO of claim 5, wherein a length of a conductor used to couple the first transformer to the output of the multi-injection VCO is equal to a length of a conductor used to couple the second transformer to the output of the multi-injection VCO.

7. The multi-injection VCO of claim 5, wherein a winding of the first transformer is used to form a resonator of the first inductor-capacitor tank VCO, and a winding of the second transformer is used to form a resonator of the second inductor-capacitor tank VCO.

8. The multi-injection VCO of claim 7, wherein the winding of the first transformer and the winding of the second transformer are spiral inductors.

9. The multi-injection VCO of claim 1, wherein the output coupler is configured to couple the first oscillating signal to the second oscillating signal substantially in-phase with each other.

10. A multi-injection voltage controlled oscillator (VCO) for providing an output oscillating signal at an output, the multi-injection VCO comprising:
   a first inductor-capacitor tank VCO configured to generate a first oscillating signal;
   a second inductor-capacitor tank VCO configured to generate a second oscillating signal; and
   an output coupler configured to magnetically couple the first oscillating signal to the second oscillating signal in parallel to provide the output oscillating signal at the output.

11. The multi-injection VCO of claim 10, wherein the output coupler comprises:
   a first transformer configured to magnetically couple the first oscillating signal to the output; and
   a second transformer configured to magnetically couple the second oscillating signal to the output.

12. The multi-injection VCO of claim 11, wherein a length of a conductor used to couple the first transformer to the output of the multi-injection VCO is equal to a length of a conductor used to couple the second transformer to the output of the multi-injection VCO.

13. The multi-injection VCO of claim 11, wherein a winding of the first transformer is used to form a resonator of the first inductor-capacitor tank VCO, and a winding of the second transformer is used to form a resonator of the second inductor-capacitor tank VCO.

14. The multi-injection VCO of claim 13, wherein the winding of the first transformer and the winding of the second transformer are spiral inductors.

15. The multi-injection VCO of claim 10, wherein the output coupler is configured to couple the first oscillating signal to the second oscillating signal substantially in-phase with each other.

16. A multi-injection voltage controlled oscillator (VCO) comprising:
   a first inductor-capacitor tank VCO configured to generate a first oscillating signal;
   a second inductor-capacitor tank VCO configured to generate a second oscillating signal; and
   an output coupler configured to magnetically couple the first oscillating signal to the output using a first transformer and to magnetically couple the second oscillating signal to the output using a second transformer.

17. The multi-injection VCO of claim 16, wherein a winding of the first transformer is used to form a resonator of the first inductor-capacitor tank VCO, and a winding of the second transformer is used to form a resonator of the second inductor-capacitor tank VCO.

18. The multi-injection VCO of claim 17, wherein the winding of the first transformer and the winding of the second transformer are spiral inductors.

19. The multi-injection VCO of claim 16, wherein the output coupler is configured to provide both the first oscillating signal and second oscillating signal at the output substantially in-phase with each other.

20. The multi-injection VCO of claim 16, wherein a length of a conductor used to couple the first transformer to the output of the multi-injection VCO is equal to a length of a conductor used to couple the second transformer to the output of the multi-injection VCO.

* * * * *